United States Patent
Witherspoon

(10) Patent No.: US 12,315,467 B2
(45) Date of Patent: May 27, 2025

(54) SYSTEMS AND METHODS FOR CREATING ILLUSIONS OF SKYLIGHTS AND WINDOWS

(71) Applicant: The Sky Factory, LC, Fairfield, IA (US)

(72) Inventor: Skye Witherspoon, Fairfield, IA (US)

(73) Assignee: The Sky Factory, LC, Fairfield, IA (US)

( * ) Notice: Subject to any disclaimer, the term of this patent is extended or adjusted under 35 U.S.C. 154(b) by 0 days.

(21) Appl. No.: 18/384,033

(22) Filed: Oct. 26, 2023

(65) Prior Publication Data

US 2024/0203367 A1   Jun. 20, 2024

Related U.S. Application Data

(60) Provisional application No. 63/419,389, filed on Oct. 26, 2022.

(51) Int. Cl.
*G09G 3/34* (2006.01)
*H01L 25/075* (2006.01)

(52) U.S. Cl.
CPC .......... *G09G 3/3413* (2013.01); *G09G 3/342* (2013.01); *H01L 25/0753* (2013.01); *G09G 2320/0626* (2013.01)

(58) Field of Classification Search
CPC ............. G09G 3/3413; G09G 3/342; G09G 2320/0626; H01L 25/0753; F21S 8/026; F21S 8/061; E04B 9/32; E04B 9/006; E04B 9/242; F21V 3/00; F21V 21/049; F21V 33/006; F21W 2121/00; F21W 2121/008; F21W 2131/205; F21Y 2113/00; Y10S 362/806; Y10S 362/812
See application file for complete search history.

(56) References Cited

U.S. PATENT DOCUMENTS

| | | | |
|---|---|---|---|
| 7,959,316 B1 * | 6/2011 | Schreiber | F21S 8/04 52/28 |
| 8,096,671 B1 * | 1/2012 | Cronk | F21S 2/005 362/147 |
| 11,512,823 B2 | 11/2022 | Schreiber et al. | |
| 2007/0008729 A1 * | 1/2007 | Tarpo | F21S 8/026 362/351 |
| 2010/0171442 A1 * | 7/2010 | Draper | H05B 45/22 315/297 |
| 2013/0147388 A1 * | 6/2013 | Frost | H05B 45/327 315/250 |

(Continued)

*Primary Examiner* — Abhishek Sarma
(74) *Attorney, Agent, or Firm* — Simmons Perrine Moyer Bergman PLC

(57) ABSTRACT

A system and method for creating trompe-l'oeil skylights and windows where a light emitting image of scene is provided in a structure configured to emulate a skylight or window frame, including an embodiment of a system that modulates using multiple modalities, the light emitted by the light emitting image so as to improve realism experienced by users exposed to the light emitting image over an extended period of time, where the multiple modalities includes a circadian rhythm modality, and an ultradian modality, where the ultradian modality is provide by randomly calling on grayscale video files to module the signals from DMX decoders to LEDs by using captured data from actual sky observations over extended periods of time.

18 Claims, 20 Drawing Sheets

(56) References Cited

U.S. PATENT DOCUMENTS

| | | | | |
|---|---|---|---|---|
| 2015/0043199 A1* | 2/2015 | Schreiber | ............ | E04B 9/32 |
| | | | | 362/97.4 |
| 2018/0246270 A1* | 8/2018 | Di Trapani | ............ | F21S 8/006 |
| 2020/0245422 A1* | 7/2020 | Soler | ............ | H05B 45/24 |

* cited by examiner

| SCENE | Red | Green | White Spot | White | Time |
|---|---|---|---|---|---|
| 1 | 0 | 0 | 0 | 0 | 6:10:00 AM |
| 2 | 0 | 0 | 10 | 10 | 6:36:00 AM |
| 3 | 17 | 14 | 10 | 10 | 7:02:00 AM |
| 4 | 20 | 15 | 11 | 11 | 7:03:30 AM |
| 5 | 30 | 20 | 14 | 14 | 7:04:30 AM |
| 6 | 40 | 26 | 18 | 18 | 7:05:15 AM |
| 7 | 57 | 30 | 22 | 22 | 7:06:00 AM |
| 8 | 80 | 40 | 26 | 26 | 7:06:40 AM |
| 9 | 110 | 48 | 30 | 30 | 7:07:20 AM |
| 10 | 120 | 44 | 34 | 34 | 7:08:00 AM |
| 11 | 140 | 43 | 38 | 38 | 7:08:30 AM |
| 12 | 140 | 50 | 42 | 42 | 7:09:00 AM |
| 13 | 140 | 55 | 47 | 47 | 7:10:00 AM |
| 14 | 140 | 60 | 53 | 53 | 7:12:00 AM |
| 15 | 135 | 65 | 58 | 58 | 7:13:00 AM |
| 16 | 125 | 65 | 64 | 64 | 7:18:00 AM |
| 17 | 115 | 60 | 71 | 71 | 7:24:00 AM |
| 18 | 115 | 70 | 78 | 78 | 7:31:00 AM |
| 19 | 110 | 78 | 87 | 87 | 7:38:00 AM |
| 20 | 110 | 75 | 96 | 96 | 7:45:00 AM |
| 21 | 100 | 65 | 106 | 106 | |
| 22 | 75.0 | 50 | 118.0 | 118.0 | |
| 23 | 50.0 | 25 | 132.0 | 132.0 | |
| 24 | 25.0 | 0 | 149.0 | 149.0 | |
| 25 | 0.0 | 0 | 171.0 | 171.0 | |
| 26 | 0.0 | 0 | 202.0 | 202.0 | 9:30:00 AM |
| 27 | 0.0 | 0 | 255.0 | 255.0 | 1:15:00 PM |
| 28 | 0.0 | 0 | 202.0 | 202.0 | |
| 29 | 25.0 | 0 | 171.0 | 171.0 | |
| 30 | 50.0 | 0 | 149.0 | 149.0 | |
| 31 | 75.0 | 25 | 132.0 | 132.0 | |
| 32 | 100.0 | 50 | 118.0 | 118.0 | |
| 33 | 110.0 | 65 | 106 | 106 | |
| 34 | 110.0 | 75 | 96 | 96 | |
| 35 | 115.0 | 78 | 87 | 87 | |
| 36 | 115.0 | 70 | 78 | 78 | |
| 37 | 125.0 | 60 | 71 | 71 | |
| 38 | 135.0 | 65 | 64 | 64 | |
| 39 | 140.0 | 60 | 58 | 58 | |
| 40 | 140.0 | 55 | 53 | 53 | |
| 41 | 135.0 | 48 | 47 | 47 | |
| 42 | 130.0 | 40 | 42 | 42 | |
| 43 | 122.0 | 30 | 38 | 38 | |
| 44 | 115 | 25 | 34 | 34 | |
| 45 | 100 | 20 | 30 | 30 | |
| 46 | 75 | 18 | 26 | 26 | |
| 47 | 45 | 16 | 22 | 22 | |
| 48 | 27 | 11 | 18 | 18 | |
| 49 | 19 | 0 | 14 | 14 | |
| 50 | 15 | 0 | 11 | 11 | |
| 51 | 12 | 0 | 10 | 10 | |
| 52 | 0 | 0 | 0 | 0 | |

FIG. 8A

| Scene | Time | Duration | Red | Green | White Spot | White |
|---|---|---|---|---|---|---|
| CHANNEL | | | 01 | 02 | 03 | 04 |
| 0 | 6:10:00 AM | 0:00:00 | 0 | 0 | 10 | 10 |
| 1 | 6:36:00 AM | 0:26:00 | 0 | 0 | 10 | 10 |
| 2 | 7:02:00 AM | 0:26:00 | 17 | 14 | 10 | 10 |
| 3 | 7:03:30 AM | 0:01:30 | 20 | 15 | 11 | 11 |
| 4 | 7:04:30 AM | 0:01:00 | 30 | 20 | 14 | 14 |
| 5 | 7:05:15 AM | 0:00:45 | 40 | 26 | 18 | 18 |
| 6 | 7:06:00 AM | 0:00:45 | 57 | 30 | 22 | 22 |
| 7 | 7:06:40 AM | 0:00:40 | 80 | 40 | 26 | 26 |
| 8 | 7:07:20 AM | 0:00:40 | 110 | 48 | 30 | 30 |
| 9 | 7:08:00 AM | 0:00:40 | 120 | 44 | 34 | 34 |
| 10 | 7:08:30 AM | 0:00:30 | 140 | 43 | 38 | 38 |
| 11 | 7:09:00 AM | 0:00:30 | 140 | 50 | 42 | 42 |
| 12 | 7:09:30 AM | 0:00:30 | 140 | 55 | 47 | 47 |
| 13 | 7:10:30 AM | 0:01:00 | 140 | 60 | 53 | 53 |
| 14 | 7:11:30 AM | 0:01:00 | 135 | 65 | 58 | 58 |
| 15 | 7:12:30 AM | 0:01:00 | 125 | 65 | 64 | 64 |
| 16 | 7:13:45 AM | 0:01:15 | 115 | 65 | 71 | 71 |
| 17 | 7:15:00 AM | 0:01:15 | 115 | 70 | 78 | 78 |
| 18 | 7:16:15 AM | 0:01:15 | 110 | 78 | 87 | 87 |
| 19 | 7:18:15 AM | 0:02:00 | 110 | 75 | 96 | 96 |
| 20 | 7:21:15 AM | 0:03:00 | 100 | 65 | 106 | 106 |
| 21 | 7:26:15 AM | 0:05:00 | 75 | 50 | 118 | 118 |
| 22 | 7:34:15 AM | 0:08:00 | 50 | 25 | 132 | 132 |
| 23 | 7:46:15 AM | 0:12:00 | 25 | 0 | 149 | 149 |
| 24 | 8:31:15 AM | 0:45:00 | 0 | 0 | 190 | 190 |
| 25 | 9:31:15 AM | 1:00:00 | 0 | 0 | 225 | 225 |
| 26 | 10:31:15 AM | 1:00:00 | 0 | 0 | 240 | 240 |
| 27 | 1:15:00 PM | 2:43:45 | 0 | 0 | 255 | 255 |
| 28 | 3:58:45 PM | 2:43:45 | 0 | 0 | 240 | 240 |
| 29 | 4:58:45 PM | 1:00:00 | 0 | 0 | 225 | 225 |
| 30 | 5:58:45 PM | 1:00:00 | 25 | 0 | 190 | 190 |
| 31 | 6:43:45 PM | 0:45:00 | 50 | 0 | 149 | 149 |
| 32 | 6:55:45 PM | 0:12:00 | 75 | 25 | 132 | 132 |
| 33 | 7:03:45 PM | 0:08:00 | 100 | 50 | 118 | 118 |
| 34 | 7:08:45 PM | 0:05:00 | 110 | 65 | 106 | 106 |
| 35 | 7:11:45 PM | 0:03:00 | 110 | 75 | 96 | 96 |
| 36 | 7:13:45 PM | 0:02:00 | 115 | 78 | 87 | 87 |
| 37 | 7:15:00 PM | 0:01:15 | 115 | 70 | 78 | 78 |
| 38 | 7:16:15 PM | 0:01:15 | 125 | 60 | 71 | 71 |
| 39 | 7:17:30 PM | 0:01:15 | 135 | 65 | 64 | 64 |
| 40 | 7:18:30 PM | 0:01:00 | 140 | 60 | 58 | 58 |
| 41 | 7:19:30 PM | 0:01:00 | 140 | 55 | 53 | 53 |
| 42 | 7:20:30 PM | 0:01:00 | 135 | 48 | 47 | 47 |
| 43 | 7:21:00 PM | 0:00:30 | 130 | 40 | 42 | 42 |
| 44 | 7:21:30 PM | 0:00:30 | 122 | 30 | 38 | 38 |
| 45 | 7:22:00 PM | 0:00:30 | 115 | 25 | 34 | 34 |
| 46 | 7:22:40 PM | 0:00:40 | 100 | 20 | 30 | 30 |
| 47 | 7:23:20 PM | 0:00:40 | 75 | 18 | 26 | 26 |
| 48 | 7:24:00 PM | 0:00:40 | 45 | 16 | 22 | 22 |
| 49 | 7:24:45 PM | 0:00:45 | 27 | 11 | 18 | 18 |
| 50 | 7:25:30 PM | 0:00:45 | 19 | 0 | 14 | 14 |
| 51 | 7:26:30 PM | 0:01:00 | 15 | 0 | 11 | 11 |
| 52 | 7:28:00 PM | 0:01:30 | 12 | 0 | 10 | 10 |
| 53 | 7:54:00 PM | 0:26:00 | 0 | 0 | 10 | 10 |
| 54 | 8:20:00 PM | 0:26:00 | 0 | 0 | 10 | 10 |

FIG. 8C

| Scene | Red | Green | White Spot | White | Time step (lin | Degrees | Time COS | 4 |
|---|---|---|---|---|---|---|---|---|
| 1 | 0 | 0 | 0 | 0 | 0 | 180 | 0 | |
| 2 | 17 | 14 | 10 | 10 | 6.74603175 | 183 | 1 | |
| 3 | 30 | 20 | 14 | 14 | 13.4920635 | 186 | 2 | |
| 4 | 40 | 26 | 18 | 18 | 20.2380952 | 189 | 5 | |
| 5 | 57 | 30 | 22 | 22 | 26.984127 | 192 | 9 | |
| 6 | 80 | 40 | 26 | 26 | 33.7301587 | 195 | 14 | |
| 7 | 110 | 48 | 30 | 30 | 40.4761905 | 197 | 20 | |
| 8 | 120 | 44 | 34 | 34 | 47.2222222 | 200 | 27 | |
| 9 | 140 | 43 | 38 | 38 | 53.968254 | 203 | 35 | |
| 10 | 140 | 50 | 42 | 42 | 60.7142857 | 206 | 44 | |
| 11 | 139 | 52 | 46 | 46 | 67.4603175 | 209 | 54 | |
| 12 | 138 | 55 | 50 | 50 | 74.2063492 | 212 | 65 | |
| 13 | 136 | 60 | 54 | 54 | 80.952381 | 215 | 77 | |
| 14 | 135 | 65 | 58 | 58 | 87.6984127 | 218 | 90 | |
| 15 | 131 | 67 | 62 | 62 | 94.4444444 | 221 | 104 | |
| 16 | 127 | 70 | 66 | 66 | 101.190476 | 224 | 118 | |
| 17 | 123 | 73 | 70 | 70 | 107.936508 | 226 | 134 | |
| 18 | 119 | 76 | 74 | 74 | 114.68254 | 229 | 150 | |
| 19 | 115 | 78 | 78 | 78 | 121.428571 | 232 | 167 | |
| 20 | 112 | 75 | 82 | 82 | 128.174603 | 235 | 184 | |
| 21 | 110 | 72 | 86 | 86 | 134.920635 | 238 | 203 | |
| 22 | 108 | 68 | 90 | 90 | 141.666667 | 241 | 221 | |
| 23 | 106 | 64 | 94 | 94 | 148.412698 | 244 | 241 | |
| 24 | 104 | 60 | 98 | 98 | 155.15873 | 247 | 260 | |
| 25 | 102 | 55 | 102 | 102 | 161.904762 | 250 | 281 | |
| 26 | 100 | 50 | 106 | 106 | 168.650794 | 253 | 301 | |
| 27 | 91 | 41 | 110 | 110 | 175.396825 | 255 | 322 | |
| 28 | 83 | 33 | 114 | 114 | 182.142857 | 258 | 343 | |
| 29 | 75 | 25 | 118 | 118 | 188.888889 | 261 | 365 | |
| 30 | 69 | 23 | 122 | 122 | 195.634921 | 264 | 386 | |
| 31 | 63 | 21 | 126 | 126 | 202.380952 | 267 | 408 | |
| 32 | 57 | 19 | 130 | 130 | 209.126984 | 270 | 430 | FIG. 8E-1 |
| 33 | 51 | 17 | 134 | 134 | 215.873016 | 273 | 452 | |
| 34 | 45 | 15 | 138 | 138 | 222.619048 | 276 | 474 | |
| 35 | 39 | 13 | 142 | 142 | 229.365079 | 279 | 495 | |
| 36 | 33 | 11 | 146 | 146 | 236.111111 | 282 | 517 | |
| 37 | 27 | 9 | 150 | 150 | 242.857143 | 285 | 538 | |
| 38 | 21 | 7 | 154 | 154 | 249.603175 | 287 | 559 | |
| 39 | 15 | 5 | 158 | 158 | 256.349206 | 290 | 579 | |
| 40 | 9 | 3 | 162 | 162 | 263.095238 | 293 | 600 | |
| 41 | 3 | 2 | 166 | 166 | 269.84127 | 296 | 619 | |
| 42 | 0 | 0 | 170 | 170 | 276.587302 | 299 | 639 | |
| 43 | 0 | 0 | 174 | 174 | 283.333333 | 302 | 657 | |
| 44 | 0 | 0 | 178 | 178 | 290.079365 | 305 | 676 | |
| 45 | 0 | 0 | 182 | 182 | 296.825397 | 308 | 693 | |
| 46 | 0 | 0 | 186 | 186 | 303.571429 | 311 | 710 | |
| 47 | 0 | 0 | 190 | 190 | 310.31746 | 314 | 726 | |
| 48 | 0 | 0 | 194 | 194 | 317.063492 | 316 | 742 | |
| 49 | 0 | 0 | 198 | 198 | 323.809524 | 319 | 756 | |
| 50 | 0 | 0 | 202 | 202 | 330.555556 | 322 | 770 | |
| 51 | 0 | 0 | 206 | 206 | 337.301587 | 325 | 783 | |
| 52 | 0 | 0 | 210 | 210 | 344.047619 | 328 | 795 | |
| 53 | 0 | 0 | 214 | 214 | 350.793651 | 331 | 806 | |
| 54 | 0 | 0 | 218 | 218 | 357.539683 | 334 | 816 | |
| 55 | 0 | 0 | 222 | 222 | 364.285714 | 337 | 825 | |
| 56 | 0 | 0 | 226 | 226 | 371.031746 | 340 | 833 | |
| 57 | 0 | 0 | 230 | 230 | 377.777778 | 343 | 840 | |
| 58 | 0 | 0 | 234 | 234 | 384.52381 | 345 | 846 | |
| 59 | 0 | 0 | 238 | 238 | 391.269841 | 348 | 851 | |
| 60 | 0 | 0 | 242 | 242 | 398.015873 | 351 | 855 | |
| 61 | 0 | 0 | 246 | 246 | 404.761905 | 354 | 858 | |
| 62 | 0 | 0 | 250 | 250 | 411.507937 | 357 | 859 | |

| | | | | | | | |
|---|---|---|---|---|---|---|---|
| 63 | 0 | 0 | 255 | 255 | 418.253968 | 360 | 860 |
| 64 | 0 | 0 | 250 | 250 | 425 | 363 | 859 |
| 65 | 0 | 0 | 246 | 246 | 431.746032 | 366 | 858 |
| 66 | 0 | 0 | 242 | 242 | 438.492063 | 369 | 855 |
| 67 | 0 | 0 | 238 | 238 | 445.238095 | 372 | 851 |
| 68 | 0 | 0 | 234 | 234 | 451.984127 | 375 | 846 |
| 69 | 0 | 0 | 230 | 230 | 458.730159 | 377 | 840 |
| 70 | 0 | 0 | 226 | 226 | 465.47619 | 380 | 833 |
| 71 | 0 | 0 | 222 | 222 | 472.222222 | 383 | 825 |
| 72 | 0 | 0 | 218 | 218 | 478.968254 | 386 | 816 |
| 73 | 0 | 0 | 214 | 214 | 485.714286 | 389 | 806 |
| 74 | 0 | 0 | 210 | 210 | 492.460317 | 392 | 795 |
| 75 | 0 | 0 | 206 | 206 | 499.206349 | 395 | 783 |
| 76 | 0 | 0 | 202 | 202 | 505.952381 | 398 | 770 |
| 77 | 0 | 0 | 198 | 198 | 512.698413 | 401 | 756 |
| 78 | 0 | 0 | 194 | 194 | 519.444444 | 404 | 742 |
| 79 | 0 | 0 | 190 | 190 | 526.190476 | 406 | 726 |
| 80 | 0 | 0 | 186 | 186 | 532.936508 | 409 | 710 |
| 81 | 0 | 0 | 182 | 182 | 539.68254 | 412 | 693 |
| 82 | 0 | 0 | 178 | 178 | 546.428571 | 415 | 676 |
| 83 | 5 | 3 | 174 | 174 | 553.174603 | 418 | 657 |
| 84 | 10 | 6 | 170 | 170 | 559.920635 | 421 | 639 |
| 85 | 15 | 9 | 166 | 166 | 566.666667 | 424 | 619 |
| 86 | 20 | 12 | 162 | 162 | 573.412698 | 427 | 600 |
| 87 | 25 | 15 | 158 | 158 | 580.15873 | 430 | 579 |
| 88 | 30 | 18 | 154 | 154 | 586.904762 | 433 | 559 |
| 89 | 35 | 21 | 150 | 150 | 593.650794 | 435 | 538 |
| 90 | 40 | 24 | 146 | 146 | 600.396825 | 438 | 517 |
| 91 | 45 | 27 | 142 | 142 | 607.142857 | 441 | 495 |
| 92 | 50 | 31 | 138 | 138 | 613.888889 | 444 | 474 |
| 93 | 55 | 34 | 134 | 134 | 620.634921 | 447 | 452 |
| 94 | 60 | 38 | 130 | 130 | 627.380952 | 450 | 430 |
| 95 | 65 | 42 | 126 | 126 | 634.126984 | 453 | 408 |
| 96 | 70 | 46 | 122 | 122 | 640.873016 | 456 | 386 |
| 97 | 75 | 50 | 118 | 118 | 647.619048 | 459 | 365 |
| 98 | 83 | 50 | 114 | 114 | 654.365079 | 462 | 343 |
| 99 | 92 | 50 | 110 | 110 | 661.111111 | 465 | 322 |
| 100 | 100 | 50 | 106 | 106 | 667.857143 | 467 | 301 |
| 101 | 103 | 53 | 102 | 102 | 674.603175 | 470 | 281 |
| 102 | 105 | 56 | 98 | 98 | 681.349206 | 473 | 260 |
| 103 | 107 | 59 | 94 | 94 | 688.095238 | 476 | 241 |
| 104 | 109 | 62 | 90 | 90 | 694.84127 | 479 | 221 |
| 105 | 111 | 65 | 86 | 86 | 701.587302 | 482 | 203 |
| 106 | 113 | 68 | 82 | 82 | 708.333333 | 485 | 184 |
| 107 | 115 | 70 | 78 | 78 | 715.079365 | 488 | 167 |
| 108 | 119 | 68 | 74 | 74 | 721.825397 | 491 | 150 |
| 109 | 123 | 66 | 70 | 70 | 728.571429 | 494 | 134 |
| 110 | 127 | 64 | 66 | 66 | 735.31746 | 496 | 118 |
| 111 | 131 | 62 | 62 | 62 | 742.063492 | 499 | 104 |
| 112 | 135 | 60 | 58 | 58 | 748.809524 | 502 | 90 |
| 113 | 133 | 55 | 54 | 54 | 755.555556 | 505 | 77 |
| 114 | 132 | 50 | 50 | 50 | 762.301587 | 508 | 65 |
| 115 | 131 | 45 | 46 | 46 | 769.047619 | 511 | 54 |
| 116 | 130 | 40 | 42 | 42 | 775.793651 | 514 | 44 |
| 117 | 122 | 30 | 38 | 38 | 782.539683 | 517 | 35 |
| 118 | 115 | 25 | 34 | 34 | 789.285714 | 520 | 27 |
| 119 | 100 | 20 | 30 | 30 | 796.031746 | 523 | 20 |
| 120 | 75 | 18 | 26 | 26 | 802.777778 | 525 | 14 |
| 121 | 45 | 16 | 22 | 22 | 809.52381 | 528 | 9 |
| 122 | 27 | 11 | 18 | 18 | 816.269841 | 531 | 5 |
| 123 | 19 | 0 | 14 | 14 | 823.015873 | 534 | 2 |
| 124 | 12 | 0 | 10 | 10 | 829.761905 | 537 | 1 |
| 125 | 0 | 0 | 0 | 0 | 836.507937 | 540 | 0 |

FIG. 8E-2

| Scene | 180-180 | | COS(THETA) | Value (DMX) | X-Val | Light intensity [%] | Time [t] |
|---|---|---|---|---|---|---|---|
| 1 | 0 | 180 | 10.00 | 2560 | 0 | 3.91% | 6:10:00 AM |
| 1 | 1 | 184 | 10.00 | 2560 | 1 | 3.91% | 6:18:25 AM |
| 1 | 2 | 187 | 10.00 | 2560 | 2 | 3.91% | 6:26:50 AM |
| 1 | 3 | 191 | 10.00 | 2560 | 3 | 3.91% | 6:35:15 AM |
| 1 | 4 | 195 | 10.00 | 2560 | 4 | 3.91% | 6:43:40 AM |
| 1 | 5 | 198 | 10.00 | 2561 | 5 | 3.91% | 6:52:05 AM |
| 1 | 6 | 202 | 10.01 | 2563 | 6 | 3.91% | 7:00:30 AM |
| 1 | 7 | 205 | 10.03 | 2567 | 7 | 3.92% | 7:08:55 AM |
| 1 | 8 | 209 | 10.06 | 2576 | 8 | 3.93% | 7:17:20 AM |
| 1 | 9 | 213 | 10.12 | 2591 | 9 | 3.95% | 7:25:45 AM |
| 1 | 10 | 216 | 10.23 | 2618 | 10 | 3.99% | 7:34:10 AM |
| 2 | 11 | 220 | 10.39 | 2660 | 11 | 4.06% | 7:42:35 AM |
| 3 | 12 | 224 | 10.65 | 2725 | 12 | 4.16% | 7:51:00 AM |
| 4 | 13 | 227 | 11.02 | 2821 | 13 | 4.30% | 7:59:25 AM |
| 5 | 14 | 231 | 11.54 | 2955 | 14 | 4.51% | 8:07:50 AM |
| 6 | 15 | 235 | 12.27 | 3141 | 15 | 4.79% | 8:16:15 AM |
| 7 | 16 | 238 | 13.24 | 3388 | 16 | 5.17% | 8:24:40 AM |
| 8 | 17 | 242 | 14.50 | 3712 | 17 | 5.66% | 8:33:05 AM |
| 9 | 18 | 245 | 16.12 | 4126 | 18 | 6.30% | 8:41:30 AM |
| 10 | 19 | 249 | 18.15 | 4645 | 19 | 7.09% | 8:49:55 AM |
| 11 | 20 | 253 | 20.64 | 5285 | 20 | 8.06% | 8:58:20 AM |
| 12 | 21 | 256 | 23.67 | 6060 | 21 | 9.25% | 9:06:45 AM |
| 13 | 22 | 260 | 27.28 | 6984 | 22 | 10.66% | 9:15:10 AM |
| 14 | 23 | 264 | 31.53 | 8071 | 23 | 12.32% | 9:23:35 AM |
| 15 | 24 | 267 | 36.46 | 9333 | 24 | 14.24% | 9:32:00 AM |
| 16 | 25 | 271 | 42.11 | 10779 | 25 | 16.45% | 9:40:25 AM |
| 17 | 26 | 275 | 48.50 | 12416 | 26 | 18.94% | 9:48:50 AM |
| 18 | 27 | 278 | 55.65 | 14246 | 27 | 21.74% | 9:57:15 AM |
| 19 | 28 | 282 | 63.56 | 16271 | 28 | 24.83% | 10:05:40 AM |
| 20 | 29 | 285 | 72.21 | 18486 | 29 | 28.21% | 10:14:05 AM |
| 21 | 30 | 289 | 81.57 | 20883 | 30 | 31.86% | 10:22:30 AM |
| 22 | 31 | 293 | 91.60 | 23450 | 31 | 35.78% | 10:30:55 AM |
| 23 | 32 | 296 | 102.22 | 26169 | 32 | 39.93% | 10:39:20 AM |
| 24 | 33 | 300 | 113.36 | 29020 | 33 | 44.28% | 10:47:45 AM |
| 25 | 34 | 304 | 124.91 | 31977 | 34 | 48.79% | 10:56:10 AM |
| 26 | 35 | 307 | 136.76 | 35012 | 35 | 53.42% | 11:04:35 AM |
| 27 | 36 | 311 | 148.79 | 38090 | 36 | 58.12% | 11:13:00 AM |
| 28 | 37 | 315 | 160.85 | 41178 | 37 | 62.83% | 11:21:25 AM |
| 29 | 38 | 318 | 172.80 | 44237 | 38 | 67.50% | 11:29:50 AM |
| 30 | 39 | 322 | 184.49 | 47228 | 39 | 72.06% | 11:38:15 AM |
| 31 | 40 | 325 | 195.75 | 50111 | 40 | 76.46% | 11:46:40 AM |
| 32 | 41 | 329 | 206.43 | 52845 | 41 | 80.64% | 11:55:05 AM |
| 33 | 42 | 333 | 216.38 | 55392 | 42 | 84.52% | 12:03:30 PM |
| 34 | 43 | 336 | 225.44 | 57714 | 43 | 88.06% | 12:11:55 PM |
| 35 | 44 | 340 | 233.50 | 59776 | 44 | 91.21% | 12:20:20 PM |
| 36 | 45 | 344 | 240.41 | 61546 | 45 | 93.91% | 12:28:45 PM |
| 37 | 46 | 347 | 246.08 | 62997 | 46 | 96.13% | 12:37:10 PM |
| 38 | 47 | 351 | 250.41 | 64106 | 47 | 97.82% | 12:45:35 PM |
| 39 | 48 | 355 | 253.34 | 64855 | 48 | 98.96% | 12:54:00 PM |
| 40 | 49 | 358 | 254.82 | 65233 | 49 | 99.54% | 1:02:25 PM |

FIG. 8F-1

| | | | | | | | |
|---|---|---|---|---|---|---|---|
| 41 | 50 | 362 | 254.82 | 65233 | 50 | 99.54% | 1:10:50 PM |
| 42 | 51 | 365 | 253.34 | 64855 | 51 | 98.96% | 1:19:15 PM |
| 43 | 52 | 369 | 250.41 | 64106 | 52 | 97.82% | 1:27:40 PM |
| 44 | 53 | 373 | 246.08 | 62997 | 53 | 96.13% | 1:36:05 PM |
| 45 | 54 | 376 | 240.41 | 61546 | 54 | 93.91% | 1:44:30 PM |
| 46 | 55 | 380 | 233.50 | 59776 | 55 | 91.21% | 1:52:55 PM |
| 47 | 56 | 384 | 225.44 | 57714 | 56 | 88.06% | 2:01:20 PM |
| 48 | 57 | 387 | 216.38 | 55392 | 57 | 84.52% | 2:09:45 PM |
| 49 | 58 | 391 | 206.43 | 52845 | 58 | 80.64% | 2:18:10 PM |
| 50 | 59 | 395 | 195.75 | 50111 | 59 | 76.46% | 2:26:35 PM |
| 51 | 60 | 398 | 184.49 | 47228 | 60 | 72.06% | 2:35:00 PM |
| 52 | 61 | 402 | 172.80 | 44237 | 61 | 67.50% | 2:43:25 PM |
| 53 | 62 | 405 | 160.85 | 41178 | 62 | 62.83% | 2:51:50 PM |
| 54 | 63 | 409 | 148.79 | 38090 | 63 | 58.12% | 3:00:15 PM |
| 55 | 64 | 413 | 136.76 | 35012 | 64 | 53.42% | 3:08:40 PM |
| 56 | 65 | 416 | 124.91 | 31977 | 65 | 48.79% | 3:17:05 PM |
| 57 | 66 | 420 | 113.36 | 29020 | 66 | 44.28% | 3:25:30 PM |
| 58 | 67 | 424 | 102.22 | 26169 | 67 | 39.93% | 3:33:55 PM |
| 59 | 68 | 427 | 91.60 | 23450 | 68 | 35.78% | 3:42:20 PM |
| 60 | 69 | 431 | 81.57 | 20883 | 69 | 31.86% | 3:50:45 PM |
| 61 | 70 | 435 | 72.21 | 18486 | 70 | 28.21% | 3:59:10 PM |
| 62 | 71 | 438 | 63.56 | 16271 | 71 | 24.83% | 4:07:35 PM |
| 63 | 72 | 442 | 55.65 | 14246 | 72 | 21.74% | 4:16:00 PM |
| 64 | 73 | 445 | 48.50 | 12416 | 73 | 18.94% | 4:24:25 PM |
| 65 | 74 | 449 | 42.11 | 10779 | 74 | 16.45% | 4:32:50 PM |
| 66 | 75 | 453 | 36.46 | 9333 | 75 | 14.24% | 4:41:15 PM |
| 67 | 76 | 456 | 31.53 | 8071 | 76 | 12.32% | 4:49:40 PM |
| 68 | 77 | 460 | 27.28 | 6984 | 77 | 10.66% | 4:58:05 PM |
| 69 | 78 | 464 | 23.67 | 6060 | 78 | 9.25% | 5:06:30 PM |
| 70 | 79 | 467 | 20.64 | 5285 | 79 | 8.06% | 5:14:55 PM |
| 71 | 80 | 471 | 18.15 | 4645 | 80 | 7.09% | 5:23:20 PM |
| 72 | 81 | 475 | 16.12 | 4126 | 81 | 6.30% | 5:31:45 PM |
| 73 | 82 | 478 | 14.50 | 3712 | 82 | 5.66% | 5:40:10 PM |
| 74 | 83 | 482 | 13.24 | 3388 | 83 | 5.17% | 5:48:35 PM |
| 75 | 84 | 485 | 12.27 | 3141 | 84 | 4.79% | 5:57:00 PM |
| 76 | 85 | 489 | 11.54 | 2955 | 85 | 4.51% | 6:05:25 PM |
| 77 | 86 | 493 | 11.02 | 2821 | 86 | 4.30% | 6:13:50 PM |
| 78 | 87 | 496 | 10.65 | 2725 | 87 | 4.16% | 6:22:15 PM |
| 79 | 88 | 500 | 10.39 | 2660 | 88 | 4.06% | 6:30:40 PM |
| 80 | 89 | 504 | 10.23 | 2618 | 89 | 3.99% | 6:39:05 PM |
| 81 | 90 | 507 | 10.12 | 2591 | 90 | 3.95% | 6:47:30 PM |
| 82 | 91 | 511 | 10.06 | 2576 | 91 | 3.93% | 6:55:55 PM |
| 83 | 92 | 515 | 10.03 | 2567 | 92 | 3.92% | 7:04:20 PM |
| 84 | 93 | 518 | 10.01 | 2563 | 93 | 3.91% | 7:12:45 PM |
| 85 | 94 | 522 | 10.00 | 2561 | 94 | 3.91% | 7:21:10 PM |
| 86 | 95 | 525 | 10.00 | 2560 | 95 | 3.91% | 7:29:35 PM |
| 87 | 96 | 529 | 10.00 | 2560 | 96 | 3.91% | 7:38:00 PM |
| 88 | 97 | 533 | 10.00 | 2560 | 97 | 3.91% | 7:46:25 PM |
| 89 | 98 | 536 | 10.00 | 2560 | 98 | 3.91% | 7:54:50 PM |
| 90 | 99 | 540 | 10.00 | 2560 | 99 | 3.91% | 8:03:15 PM |

FIG.8F-2

| Time | White | White Spot | Red | Green |
|---|---|---|---|---|
| 6:10:00 AM | 0 | | | |
| 6:27:00 AM | | | | |
| 6:44:00 AM | | | | |
| 7:01:00 AM | | | | |
| 7:18:00 AM | | | | |
| 7:35:00 AM | | | | |
| 7:52:00 AM | | | | |
| 8:09:00 AM | | | | |
| 8:26:00 AM | | | | |
| 8:43:00 AM | | | | |
| 9:00:00 AM | | | | |
| 9:17:00 AM | | | | |
| 9:34:00 AM | | | | |
| 9:51:00 AM | | | | |
| 10:08:00 AM | | | | |
| 10:25:00 AM | | | | |
| 10:42:00 AM | | | | |
| 10:59:00 AM | | | | |
| 11:16:00 AM | | | | |
| 11:33:00 AM | | | | |
| 11:50:00 AM | | | | |
| 12:07:00 PM | | | | |
| 12:24:00 PM | | | | |
| 12:41:00 PM | | | | |
| 12:58:00 PM | | | | |
| 1:15:00 PM | 100 | | | |
| 1:32:00 PM | | | | |
| 1:49:00 PM | | | | |
| 2:06:00 PM | | | | |
| 2:23:00 PM | | | | |
| 2:40:00 PM | | | | |
| 2:57:00 PM | | | | |
| 3:14:00 PM | | | | |
| 3:31:00 PM | | | | |
| 3:48:00 PM | | | | |
| 4:05:00 PM | | | | |
| 4:22:00 PM | | | | |
| 4:39:00 PM | | | | |
| 4:56:00 PM | | | | |
| 5:13:00 PM | | | | |
| 5:30:00 PM | | | | |
| 5:47:00 PM | | | | |
| 6:04:00 PM | | | | |
| 6:21:00 PM | | | | |
| 6:38:00 PM | | | | |
| 6:55:00 PM | | | | |
| 7:12:00 PM | | | | |
| 7:29:00 PM | | | | |
| 7:46:00 PM | | | | |
| 8:03:00 PM | | | | |
| 8:20:00 PM | 0 | | | |

FIG. 8H

|   | SINWAVE |   |
|---|---------|-----|
| 0  | 0   | 0   |
| 1  | 3   | 15  |
| 2  | 7   | 29  |
| 3  | 10  | 43  |
| 4  | 13  | 58  |
| 5  | 16  | 72  |
| 6  | 20  | 86  |
| 7  | 23  | 99  |
| 8  | 26  | 113 |
| 9  | 29  | 125 |
| 10 | 33  | 138 |
| 11 | 36  | 150 |
| 12 | 39  | 161 |
| 13 | 43  | 172 |
| 14 | 46  | 183 |
| 15 | 49  | 193 |
| 16 | 52  | 202 |
| 17 | 56  | 210 |
| 18 | 59  | 218 |
| 19 | 62  | 226 |
| 20 | 65  | 232 |
| 21 | 69  | 238 |
| 22 | 72  | 243 |
| 23 | 75  | 247 |
| 24 | 79  | 250 |
| 25 | 82  | 252 |
| 26 | 85  | 254 |
| 27 | 88  | 255 |
| 28 | 92  | 255 |
| 29 | 95  | 254 |
| 30 | 98  | 252 |
| 31 | 101 | 250 |
| 32 | 105 | 247 |
| 33 | 108 | 243 |
| 34 | 111 | 238 |
| 35 | 115 | 232 |
| 36 | 118 | 226 |
| 37 | 121 | 218 |
| 38 | 124 | 210 |
| 39 | 128 | 202 |
| 40 | 131 | 193 |
| 41 | 134 | 183 |
| 42 | 137 | 172 |
| 43 | 141 | 161 |
| 44 | 144 | 150 |
| 45 | 147 | 138 |
| 46 | 151 | 125 |
| 47 | 154 | 113 |
| 48 | 157 | 99  |
| 49 | 160 | 86  |
| 50 | 164 | 72  |
| 51 | 167 | 58  |
| 52 | 170 | 43  |
| 53 | 173 | 29  |
| 54 | 177 | 15  |
| 55 | 180 | 0   |

FIG. 8J

| Time | Red | Green | White Spot | White | Red lm | Green lm | White Spot lm | White lm | Lumen Curve |
|---|---|---|---|---|---|---|---|---|---|
| 6:10:00 AM | 0 | 0 | 0 | 0 | 0 | 0 | 0 | 0 | 0 |
| 6:36:00 AM | 0 | 0 | 52.41 | 372.70588 | 0 | 0 | 275 | 13891 | 425 |
| 7:02:00 AM | 60.65 | 101 | 52.41 | 372.70588 | 216 | 734 | 275 | 13891 | 587 |
| 7:03:30 AM | 71.35 | 109 | 57.65 | 409.97647 | 255 | 787 | 302 | 15280 | 648 |
| 7:04:30 AM | 107 | 145 | 73.38 | 521.78824 | 382 | 1049 | 385 | 19447 | 847 |
| 7:05:15 AM | 142.7 | 188 | 94.34 | 670.87059 | 509 | 1364 | 494 | 25004 | 1096 |
| 7:06:00 AM | 203.3 | 217 | 115.3 | 819.95294 | 725 | 1574 | 604 | 30560 | 1356 |
| 7:06:40 AM | 285.4 | 290 | 136.3 | 969.03529 | 1018 | 2098 | 714 | 36117 | 1680 |
| 7:07:20 AM | 392.4 | 348 | 157.2 | 1118.1176 | 1400 | 2518 | 824 | 41673 | 2015 |
| 7:08:00 AM | 428.1 | 319 | 178.2 | 1267.2 | 1527 | 2308 | 934 | 47229 | 2192 |
| 7:08:30 AM | 499.4 | 311 | 199.2 | 1416.2824 | 1782 | 2255 | 1044 | 52786 | 2426 |
| 7:09:00 AM | 499.4 | 362 | 220.1 | 1565.3647 | 1782 | 2623 | 1154 | 58342 | 2647 |
| 7:10:00 AM | 499.4 | 398 | 246.3 | 1751.7176 | 1782 | 2885 | 1291 | 65288 | 2896 |
| 7:12:00 AM | 499.4 | 435 | 277.8 | 1975.3412 | 1782 | 3147 | 1456 | 73622 | 3187 |
| 7:13:00 AM | 481.6 | 471 | 304 | 2161.6941 | 1718 | 3409 | 1593 | 80568 | 3418 |
| 7:18:00 AM | 445.9 | 471 | 335.4 | 2385.3176 | 1591 | 3409 | 1758 | 88902 | 3637 |
| 7:24:00 AM | 410.3 | 435 | 372.1 | 2646.2118 | 1464 | 3147 | 1950 | 98626 | 3863 |
| 7:31:00 AM | 410.3 | 507 | 408.8 | 2907.1059 | 1464 | 3672 | 2143 | 108350 | 4233 |
| 7:38:00 AM | 392.4 | 565 | 456 | 3242.5412 | 1400 | 4091 | 2390 | 120851 | 4656 |
| 7:45:00 AM | 392.4 | 543 | 503.2 | 3577.9765 | 1400 | 3934 | 2637 | 133353 | 5017 |
| 8:00:00 AM | 356.7 | 471 | 555.6 | 3950.6824 | 1273 | 3409 | 2912 | 147244 | 5334 |
| 8:15:00 AM | 267.6 | 362 | 618.5 | 4397.9 | 955 | 2623 | 3241 | 163913 | 5646 |
| 8:30:00 AM | 178.4 | 181 | 691.8 | 4919.7 | 636 | 1311 | 3626 | 183361 | 5971 |
| 8:45:00 AM | 89.2 | 0 | 780.9 | 5553.3 | 318 | 0 | 4093 | 206975 | 6423 |
| 9:00:00 AM | 0.0 | 0 | 896.2 | 6373.3 | 0 | 0 | 4697 | 237536 | 7270 |
| 9:30:00 AM | 0.0 | 0 | ##### | 7528.7 | 0 | 0 | 5549 | 280598 | 8587 |
| 1:15:00 PM | 0.0 | 0 | ##### | 9504.0 | 0 | 0 | 7005 | 354220 | 10841 |

FIG. 8L

SYSTEMS AND METHODS FOR CREATING ILLUSIONS OF SKYLIGHTS AND WINDOWS

CROSS-REFERENCE TO RELATED APPLICATION

This application is a utility application claiming the benefit of a provisional patent application filed on Oct. 26, 2022, with an Application No. 63/419,389; which application was filed by the same inventor, with the title of IRIS-INTEGRATED RETINAL ILLUMINATION SYSTEM, which prior application is incorporated herein in its entirety by this reference.

FIELD OF THE INVENTION

The present invention generally relates to methods and systems for creating an improved illusion of a skylight and/or a window. The present invention can also be used to dynamically control a light fixture allowing one to mimic circadian/ultradian rhythms found in nature.

BACKGROUND OF THE INVENTION

In recent years, medical professionals have used various types of methods to calm a patient who is undergoing or waiting for an important medical procedure. One example is the use of a skylight or a window so the patient can have a pleasant and/or calming view of the outdoors. While this is often very effective at helping to pacify a nervous patient, it is often not practical, especially in interior spaces without roof exposure or in shielded spaces used for radiological imaging or diagnostic equipment which often is required to be in completely enclosed and controlled areas. Other examples of needs for creating illusions of skylights and windows exist as well, for example other portions of buildings where views to nature or natural light from windows or skylights is not present.

One prior art method of pacifying a patient and helping windowless/skylight-less office workers has been to create trompe-l'oeil skylights and or windows by using translucent panels of images of the sky or natural scenes and deploying them as backlit image panels.

Such systems have been used extensively in the past and have positive characteristics. These prior art systems do have several drawbacks. While they do tend to create a more pleasant environment, they often fail to fully trick the eye into believing it is a real skylight or window.

In the past it has been known to change the brightness and color of the backlight so as to mimic brightness and color changes associated with sunrise and sunset, but the lack of perceivable change during large portions of the day, often results in the patients, or even more for workers in an environment without natural light e.g. a 9 hour work day, in still perceiving that they are not seeing an outdoor scene.

Consequently, there exists a need for improved methods and systems for creating better illusions of skylights and windows.

SUMMARY OF THE INVENTION

It is an object of the present invention to provide, in a cost-efficient manner, systems and methods for creating trompe-l'oeil skylights and windows which are more realistic, especially when the persons are exposed to these trompe-l'oeil skylights and windows for extended periods of time.

It is a feature of the present invention to provide a Light Emitting Diode (LED) illumination system for backlighting image panels for use in trompe-l'oeil skylights and windows.

It is an advantage of the present invention to achieve improved realism in the illumination of the panels by generating a credible bi-sensory (visual and spatial) playback of daylight's gradual overhead appearance. The system mimics daylight's diurnal progression while interweaving naturally occurring modulations created by clouds passing overhead. The present invention is believed to be the first tunable system that entrains our circadian rhythms, plus the ultradian rhythm governing attention, integral to cognitive performance.

It is another feature of the present invention to generate a credible illusion of spatial cognition across an image panel. This includes the use some of the following: a) elevators, as taught in U.S. Pat. No. 11,512,823 issued to applicant, The Sky Factory, of Fairfield, Iowa; b) cloud patterns that facilitate gradient lighting from neutral white to dark grey; and c) modulated LED light in registration with the cloud patterns.

It is another advantage of the present invention to provide the illusion of non-static cloud patterns by changing LED light color and intensity in predetermined manners in registration with the cloud pattern.

It is another feature of the present invention to use a daylight intensity algorithm or index of irradiance (brightness) values, which are made by measuring daylight variability across a number of temperate days. These field measurements could catalog a broad range of cloud build up and drift patterns in temperate climate conditions, thereby providing a broad range of lighting intensity variability.

It is an advantage of the present invention to feature complementary algorithms that support both circadian entrainment and ultradian restoration (recharging focused attention by engaging peripheral vision) within a credible biophilic illusion of vertical depth.

It is yet another feature of the present invention to modulate color temperature values via a weighted six-wavelength algorithm. Unlike prior art LED tunable arrays, the LED lightboxes of the present invention position the color and white LED modules according to the cloud patterns.

It is still a further feature of the present invention to employ a dynamic, weighted formula of six wavelengths—Lime Green, Mint Green, Amber, Red-Orange, Red, and Cool White—that generates a high CRI (Color Rendering Index) that imbues the sky photography with its unique realism.

It is another advantage of the present invention to provide for the ability to easily and cost efficiently change trompe-l'oeil skylights and windows by making changes to image panels with different cloud patterns or scenes and modulation of color and intensity.

The present invention is systems and methods for providing a trompe-l'oeil skylights and windows which are designed to satisfy the aforementioned needs, provide the previously stated objects, include the above-listed features, and achieve the already articulated advantages. The present invention is carried out in a "circadian rhythm only-less" manner in a sense that the sole reliance on circadian changes have been eliminated. The invention is also accomplished in "trompe-l'oeil" manner in the sense that the appearance of non-circadian color and intensity modulation better tricks the eye of the long-term observer into believing they are located in an environment where they are sensing real natural changes in lighting.

Accordingly, the present invention is a trompe-l'oeil skylight fixture system comprising:
   a fixture for generating a sky illusion, the fixture comprising:
   a fixture structure;
   an image panel, having a viewing side and an illumination side;
   a parallel array of LED light strips to illuminate said image panel on said illumination side;
   a plurality of RGB LED light modules each of which is disposed in registration with predetermined portion of said image panel, which correspond to predetermined locations of portions of images of clouds;
   an LED driver system configured to power said parallel array of LED light strips and said plurality of RGB LED modules; and
   where such LED driver system is configured to provide variations in power to each of said plurality of RGB LED light modules based upon desired changes of color of light and light intensity.

And a method of making virtual skylights and windows and luminous sky ceilings, virtual windows and interior lights comprising the steps of:
   providing an LED fixture for creating an illusion of a sky portion; and
   providing an LED driver system configured to provide improved realism by persons viewing the LED fixture for extended periods of time, by utilizing multiple modulation methods which are not limited to circadian rhythms alone.

And a method of generating an image of a sky portion comprising the steps of:
   providing an LED fixture for creating an illusion of a sky portion;
   providing an LED driver system configured to provide improved realism by persons viewing the LED fixture for extended periods of time, by utilizing multiple modulation methods which are not limited to circadian rhythms alone;
   wherein said step of utilizing multiple modulation methods further comprises utilizing an ultradian modulation method;
   wherein, the ultradian modulation method comprises:
      using a light sensor to measure outdoor light intensity levels over a plurality of different periods of time, and generating datasets therefrom, where the variations in data reflects the presence of clouds passing between the light sensor and the sun;
      using the datasets to generate grayscale videos where 100% brightness is white, and 0% brightness is black;
      uploading the grayscale videos to a lighting controller;
      randomly calling the grayscale videos throughout a day to provide an ultradian modulation method to LED drive signals;
   wherein said lighting controller is the LPC 550;
   wherein said fixture and said LED drive signal system provide output of light based upon registration of drive signals with predetermined locations of cloud images on an image panel;
   wherein the ultradian modulation method is used for generating a signal to create an illusion of a non-static image of a cloud with a static image panel;
   where the range of brightness is limited to being between 100% and 40%; and
   wherein said LED fixture comprises a plurality of parallel white LED strips, where a plurality of RGB LED modules are disposed between said plurality of parallel white LED strips; and each of the RGB LED modules is configured to provide light in six wavelengths—Lime Green, Mint Green, Amber, Red-Orange, Red, and Cool White so as to generates a high CRI (Color Rendering Index) that improves realism of the image on the image panel.

BRIEF DESCRIPTION OF THE DRAWINGS

The invention may be more fully understood by reading the following description of the preferred embodiments of the invention, in conjunction with the appended drawings wherein:

FIGS. 8A through 8M are a more detailed understanding of the sunrise sunset function of the invention which is dataset showing light intensity values and durations for a sunrise sunset cycle.

DETAILED DESCRIPTION

Figure 1:
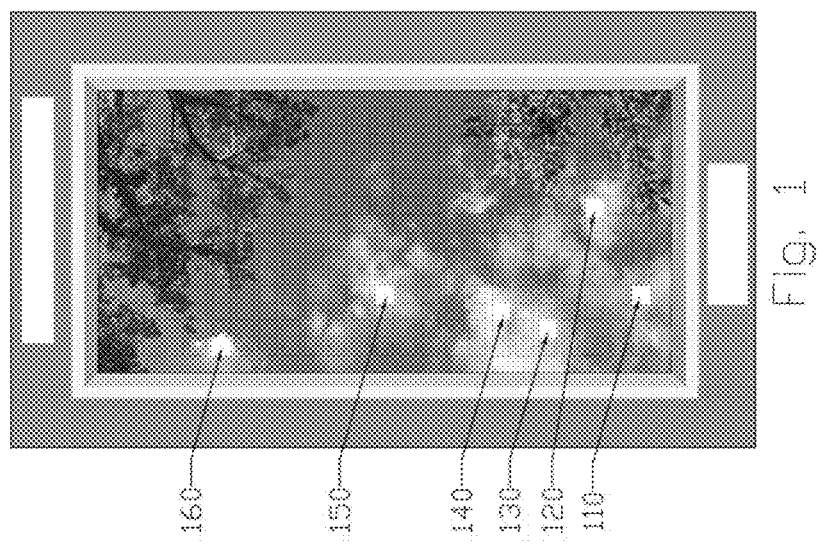
FIG. 1 is a representation of a viewing surface of a fixture of the present invention which shows trees, clouds, sky and white squares which represent areas where underlying LED modules are located.

Now referring to the drawings wherein like numerals refer to like matter throughout, and more specifically referring to FIG. 1, there is shown a viewer side of a trompe-l'oeil Skylight of the present invention, which includes sky, trees, clouds and white boxes 110, 120, 130, 140, 150 and 160 which represent the locations of areas, behind which there are LED modules of the present invention.

Figure 2:
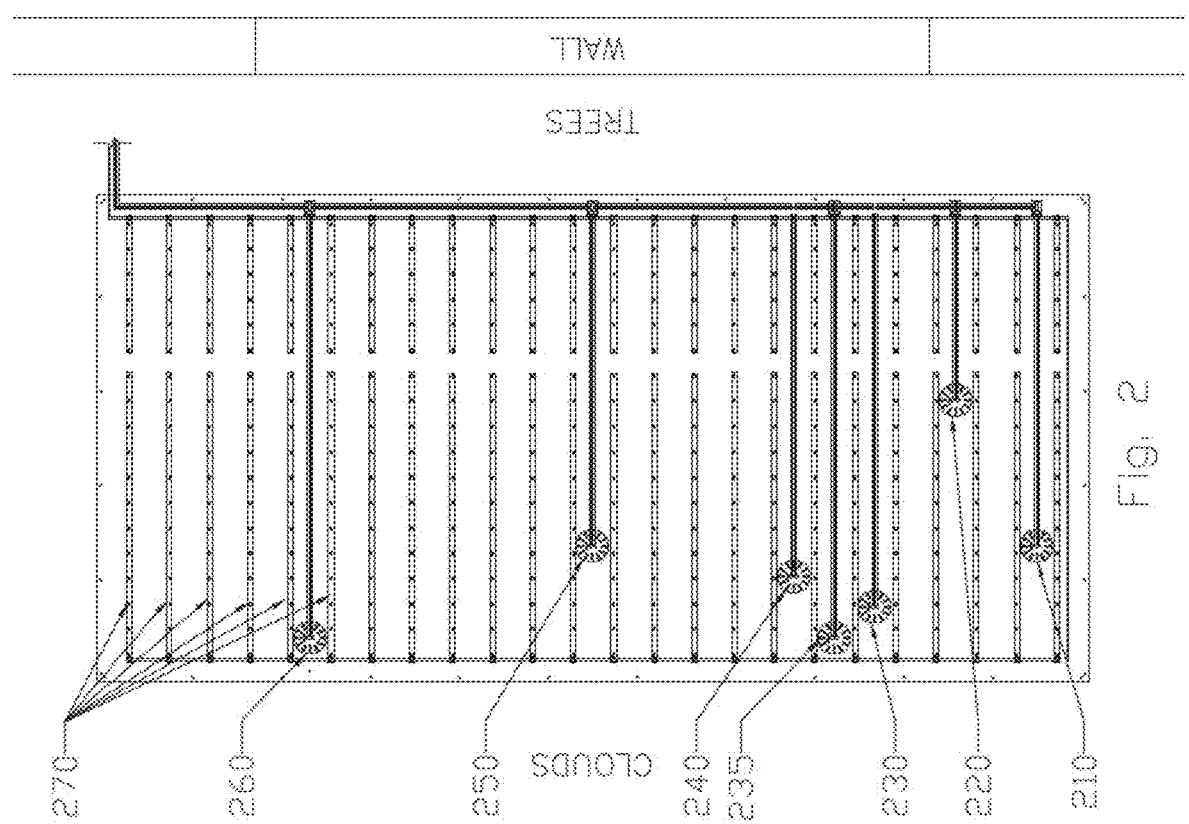
FIG. 2 is a line drawing of the LED fixture of the present invention which shows a plurality of parallel LED strips with LED modules located between some of the LED strips.

Now referring to FIG. 2, there is shown an LED fixture of the present invention which includes a plurality of parallel LED strip 270 which are white LED strips which may be controllable with varying intensities or brightness. Alternate pixels of RGB and white or other combinations of colors could be used depending on design choice.

Disposed between these LED strips are a plurality of LED modules which may include multiple colors including white and are individually controllable with respect to the other LED modules. Modules 210, 220, 230, 240, 250, and 260 are in registration with white boxes 110, 120, 130, 140, 150 and 160 respectively. LED module 235, which does not have a corresponding white square, represents one or more LED modules which are not being utilized with respect to the current image panel. There could be many more of these "unused LED modules" depending on how much flexibility in the image the customer desires. The more LED modules, the more cost, but also the more flexibility in utilizing other image panels. These modules are currently designed as being static, but in some designs there may be one or more translatable LED modules which can be slid to a different location between the LED strips. Design flexibility and cost trade-offs will determine the need for such LED module design.

Figure 3:
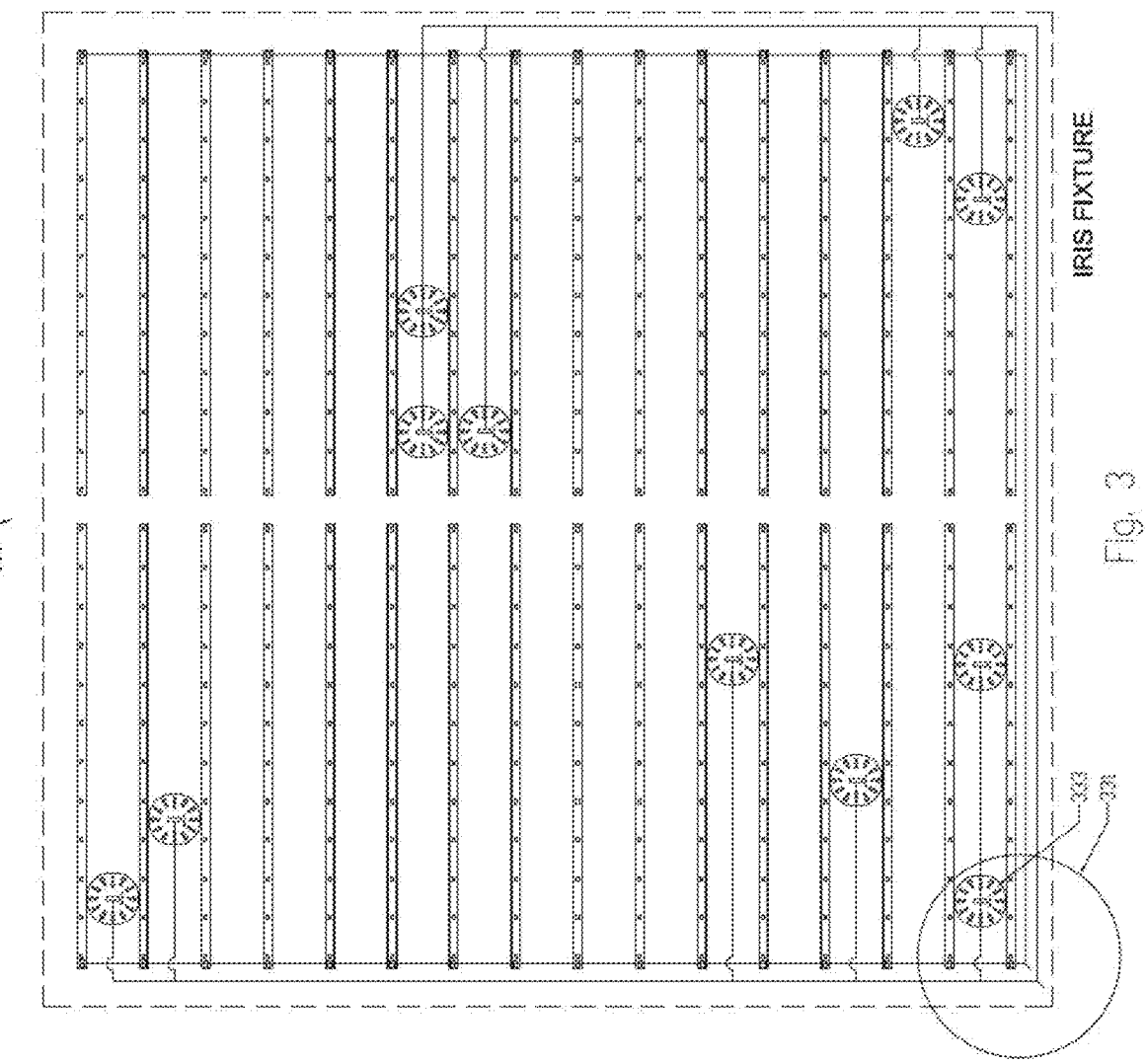
FIG. 3 is a representative LED fixture of the present invention with a detail area labeled 331.

Now referring to FIG. 3, there is shown a drawing of another representative LED fixture of the present inventions which has a detail area 331 labeled with a representative LED module 333.

Figure 4:
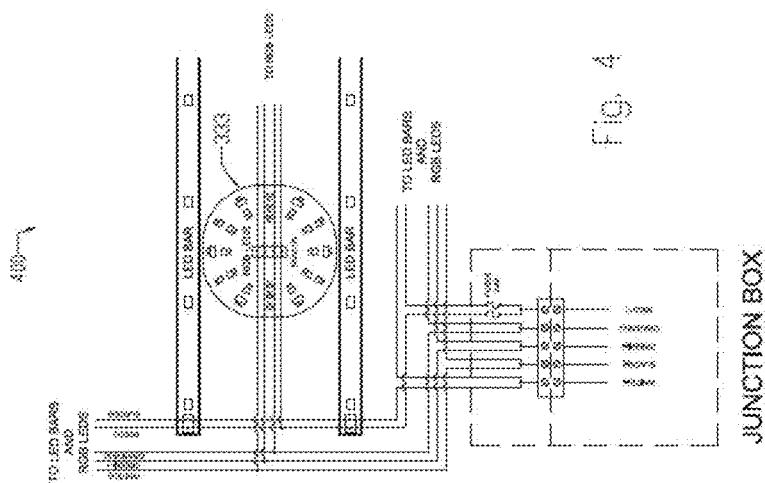
FIG. 4 is a close-up view of detail area 331 of FIG. 3 with associated circuitry.

Now referring to FIG. 4, there is shown a representative close-up view of a LED fixture which shows more detail about the RGB LED module 333 and the representative wiring connections for the LED fixture. The RGB LED module 333 is configured to emit six wavelengths of light: Lime Green, Mint Green, Amber, Red-Orange, Red, and Cool White, and it is done so as to generate a high CRI (Color Rendering Index) that improves realism.

Figure 5:
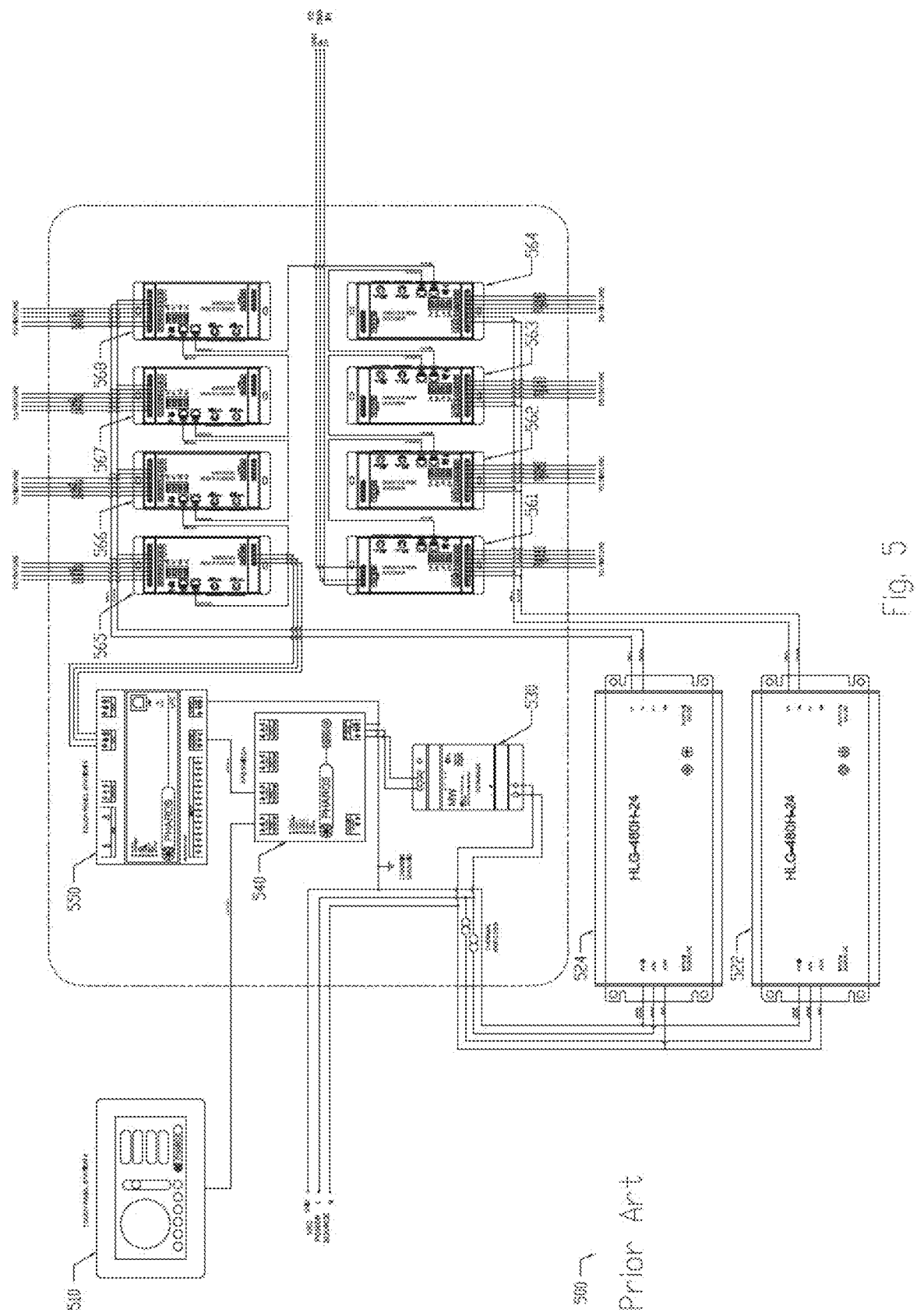
FIG. 5 is schematic diagram of representative electronic system of the present invention.

Now referring to FIG. 5, there is shown an electronic control system of the type that could be used to control the LED fixtures of the present invention. The system of FIG. 5 is the design of an actual unique system which has been used for internal testing. The structures of FIG. 5 can be purchased from multiple vendors including Pharos Architectural Controls LTD from London, UK and do not show any proprietary or unique components of the present invention. This system could be used to drive LED fixtures which are much different from the LED fixtures of the present invention. It should be understood that the structure, function and operation of the system of FIG. 5 is prior art and is well known in the art.

Shown in FIG. 5 are LED drivers 522 and 524, controls system power supply 530, XPS switch module 540 which can receive data from an ethernet connection and provide it to the LPC 550, which is the lighting controller for the system, which has the capability of receiving input from many different sources such as USB, Serial ports, including a CAT 5 cable connection from module 540. User interface module 510 is used to provide easy control of basic operation functions from a convenient location. The modes all are used in concert to provide the appropriate signals to the various DMX decoders 561-568, which output a pulse width modulated signal to the LED fixtures.

Figure 6:
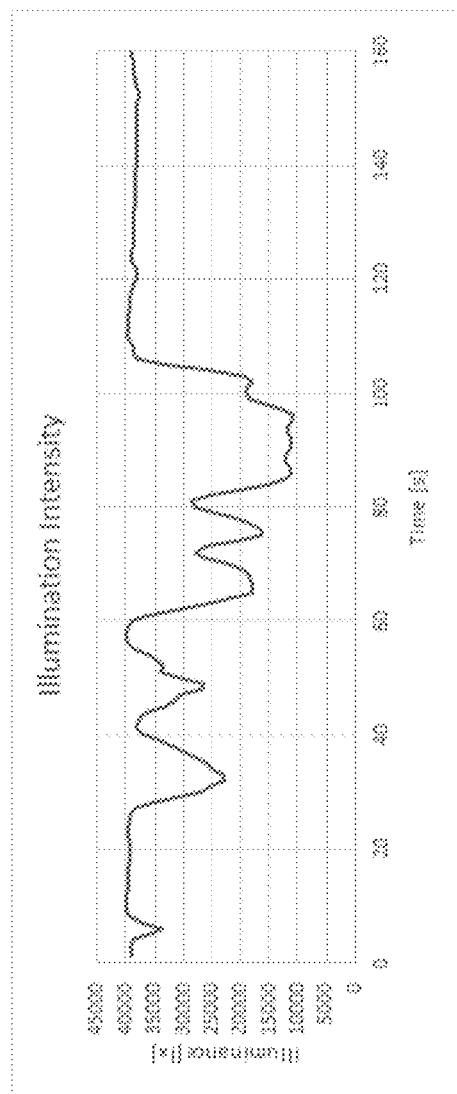
FIG. 6 is a graph of datasets of actual sky illuminance levels recorded.
Figure 7:
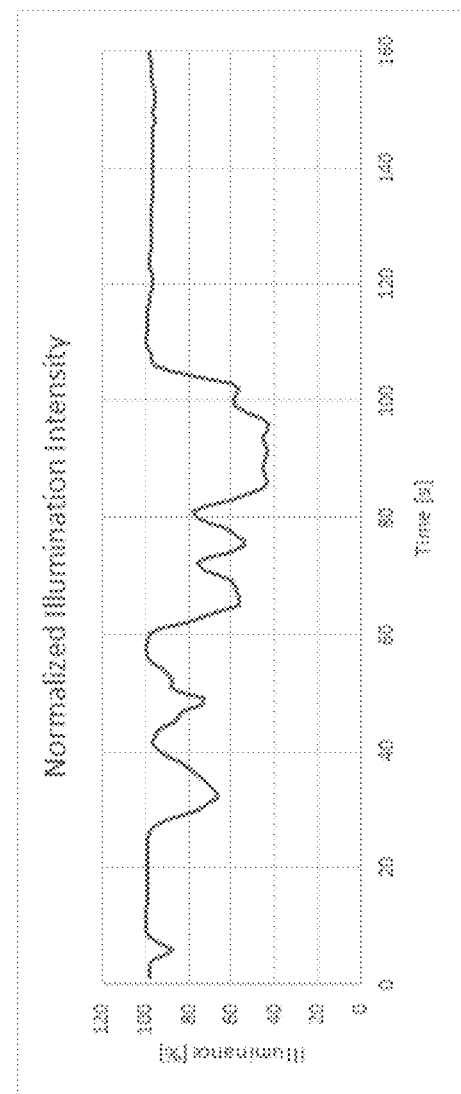
FIG. 7 is a normalized view of the data of FIG. 6.
Figure 8B:
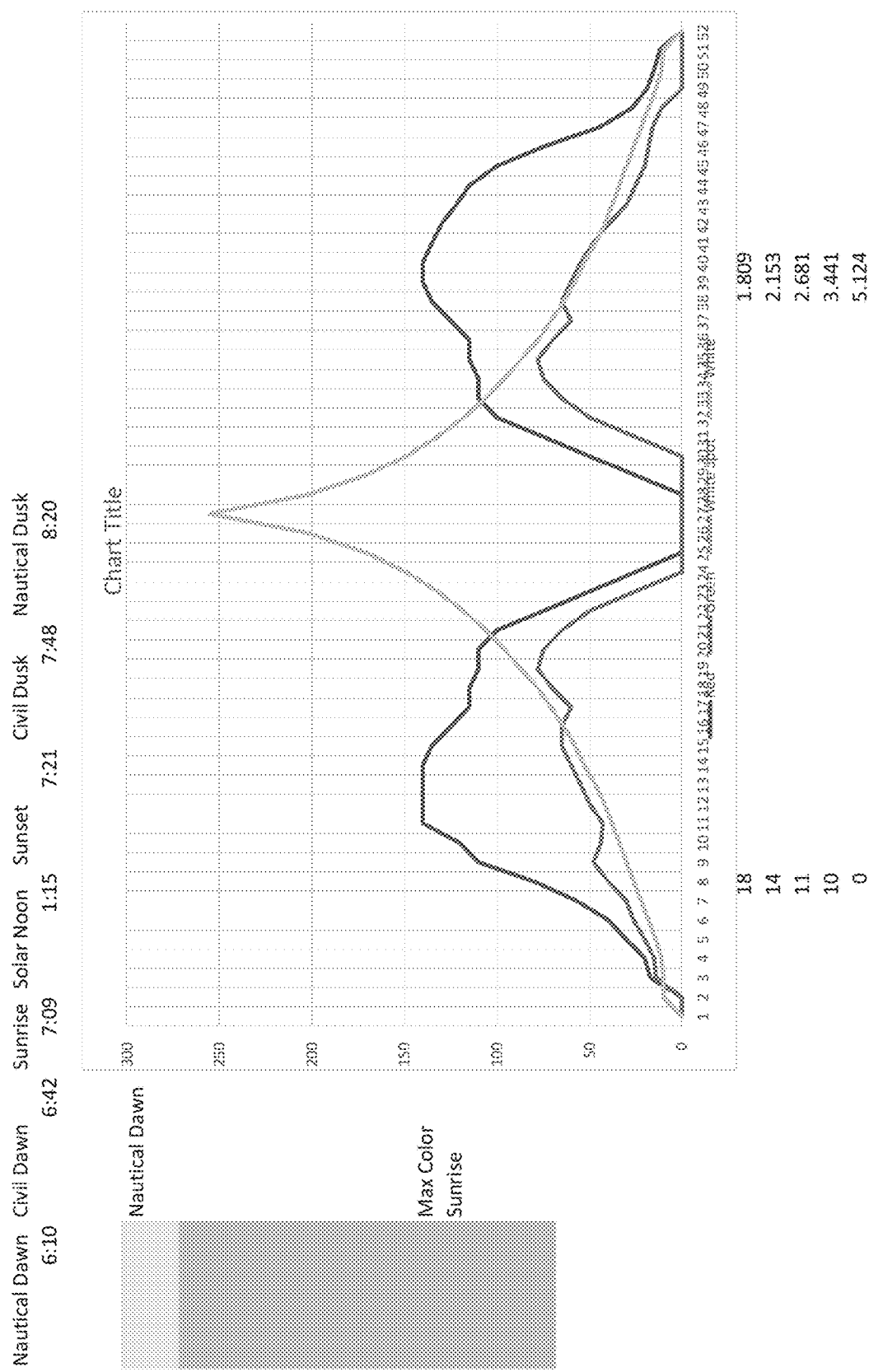
Figure 8D:
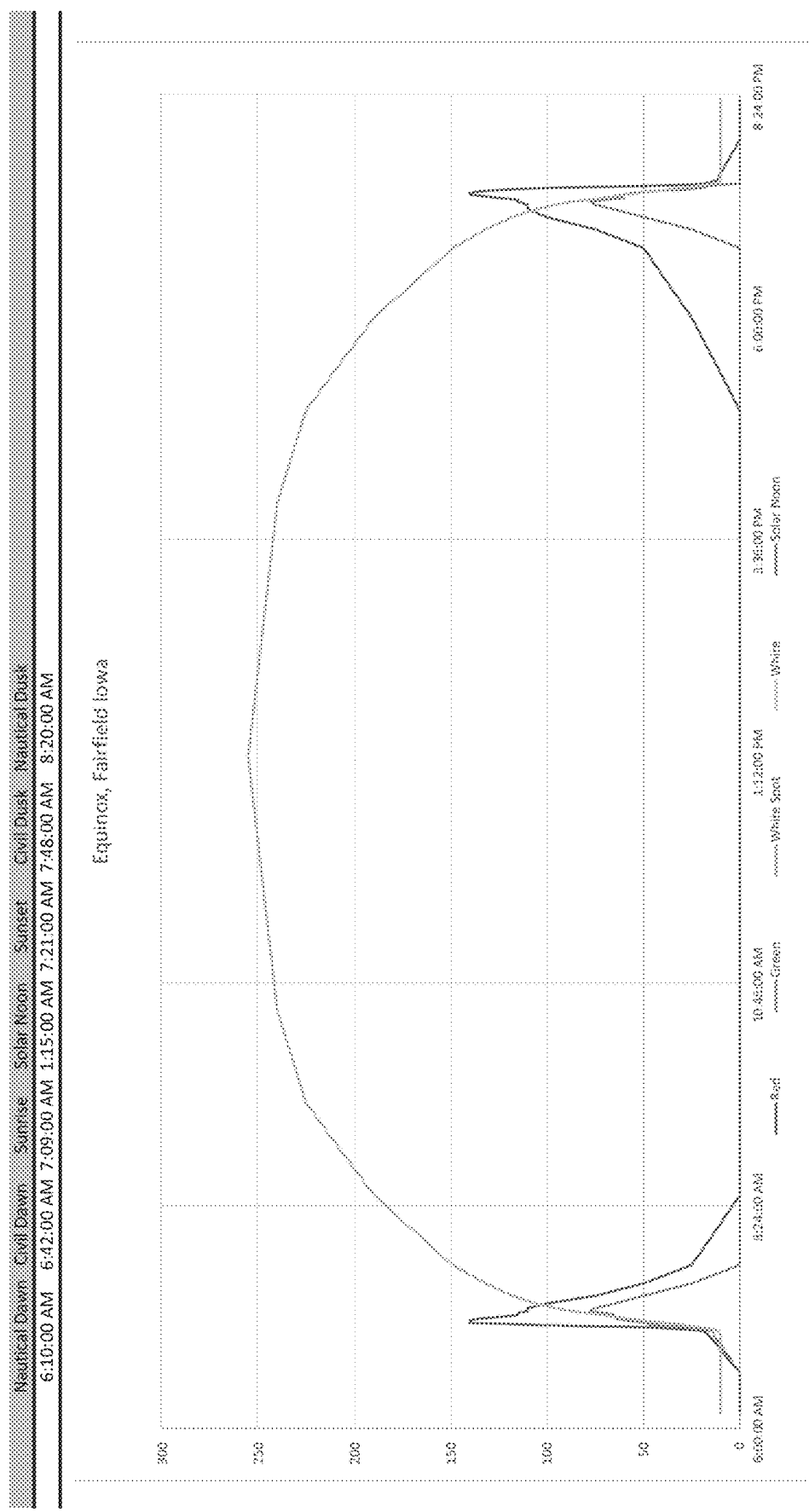
Figure 8G:
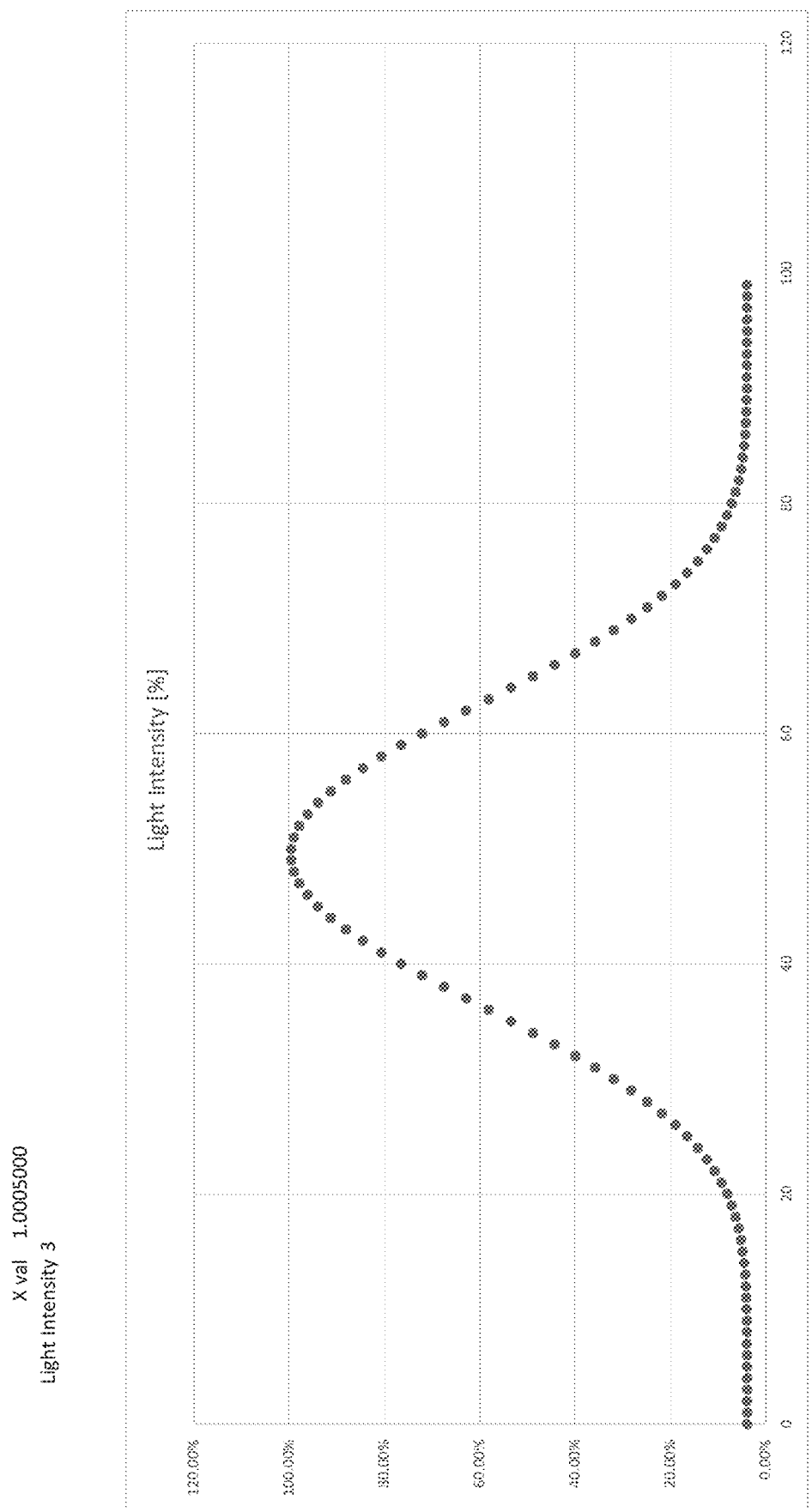
Figure 8I:
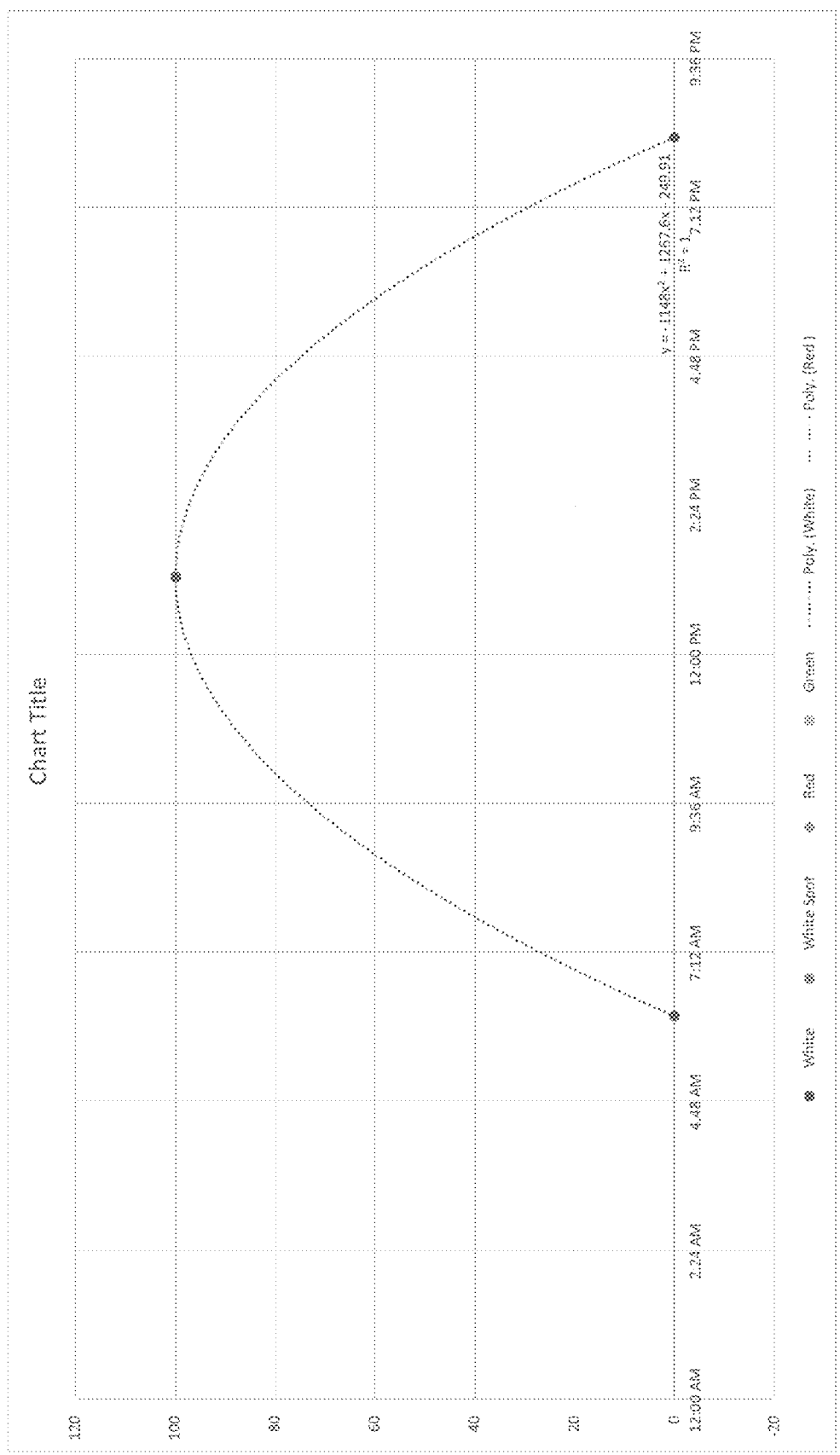
Figure 8K:
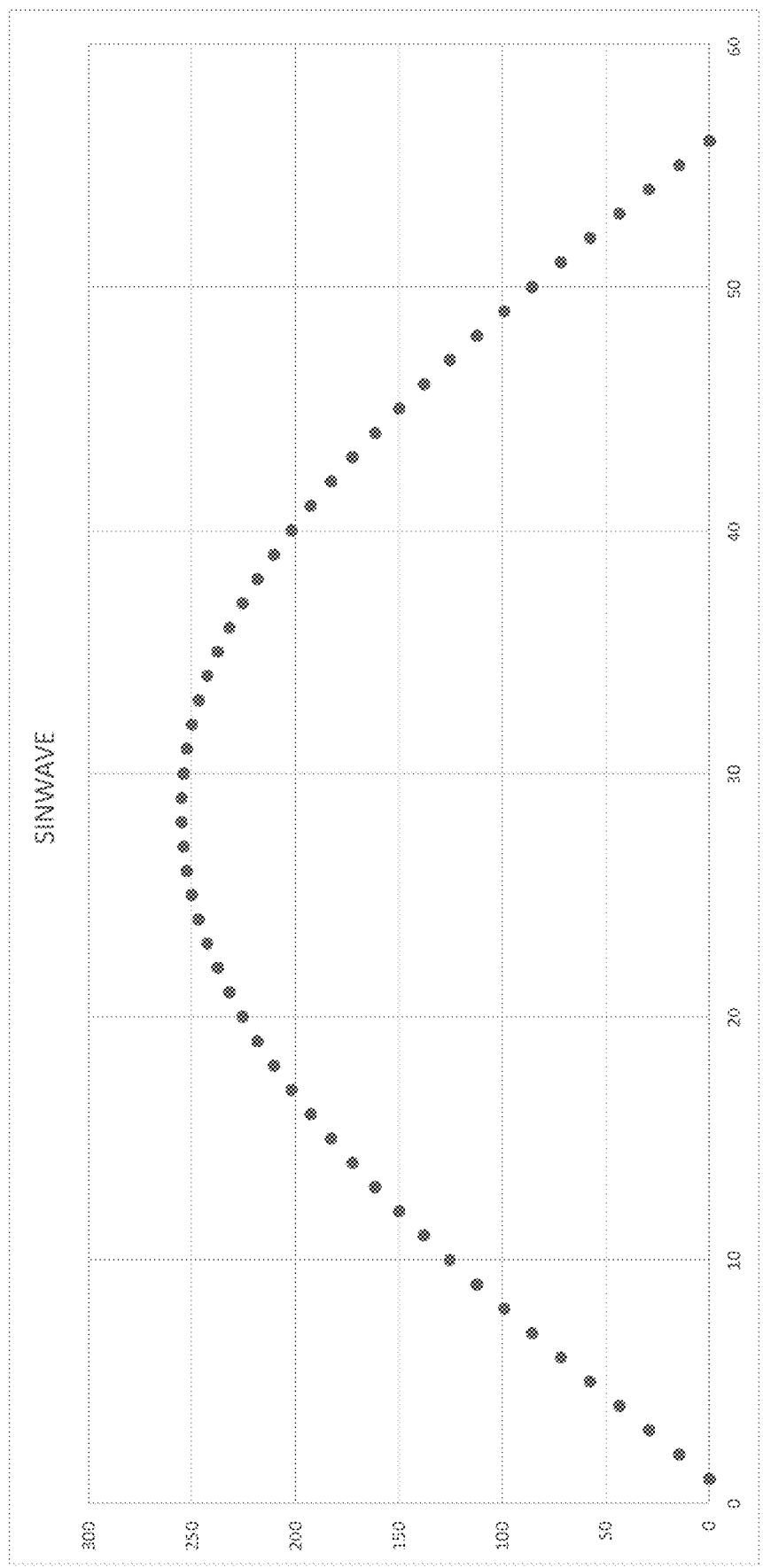
Figure 8M:
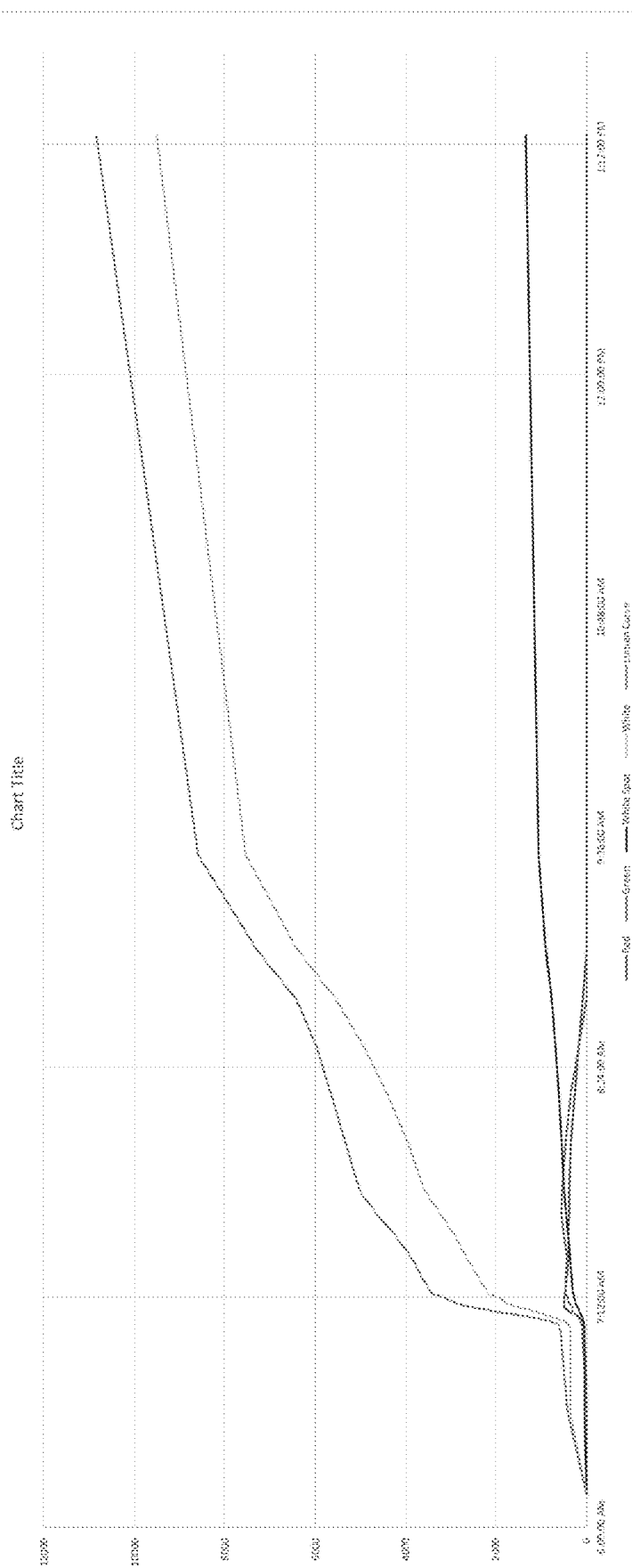

Now referring to FIGS. 6 and 7 and to DIAL—the Daylight Intensity Algorithm, which is designed to mimic the dynamic aspect of natural light throughout the course of a day. This is accomplished by modulating light intensity of Luminous SkyCeilings, Luminous Virtual Windows or other interior lighting.

Now referring to FIGS. 8A through 8M, these show a more detailed understanding of the sunrise sunset function of the invention which is dataset showing light intensity values and durations for a sunrise sunset cycle.

The system was developed by using a photo spectrometer to measure light intensity levels throughout the course of a day and repeated on numerous days. Throughout most days, clouds pass between an observer and the sun, creating significant fluctuations in light intensity.

Datasets of illuminance levels were recorded [FIG. 6] then normalized [FIG. 7] and used to create a grayscale video where 100% brightness was white, and 0% brightness was black. The video can then be used to control light intensity in such a way that the fluctuations mimic the original event of clouds passing between the observer and the sun.

The video files are then uploaded to the LPC 550 where they are called randomly throughout the day, generating a dynamic lighting system based off of natural light.

Throughout this description, reference is made to "translucent image panel." It should be understood that this could refer to any type of panel which is made to create an appearance as if looking out a skylight or window or natural light source. These panels can include images of items other than clouds. They can include images of trees or other items which might help create an illusion of looking through a skylight or window to the outdoors. The present invention is intended to cover all such items.

Throughout this description, reference is made to a patient. The present invention is intended to apply to any person for whom it is desirable to have a trompe-l'oeil skylight or window.

The term "trompe-l'oeil" is used herein to mean simulated so as to trick the eye.

The present invention is described in a preferred embodiment as being rectangular because it is believed that a rectangular skylight or window is the most common or efficient. However, other shapes, including circular and oval, can be used as well.

While the description of the present invention herein has in part been described regarding grid ceilings that use of standardized (2'×2' or 2'×4') grid system with translucent panels, it should be understood that the present invention, could be employed with non-standardized grids, hard ceilings, and with panels other than translucent panels.

It is thought that the method and apparatus of the present invention will be understood from the foregoing description and that it will be apparent that various changes may be made in the form, construction steps, and arrangement of the parts and steps thereof, without departing from the spirit and scope of the invention or sacrificing all of their material advantages. The form herein described is merely a preferred exemplary embodiment thereof.

I claim:

1. A method of generating an image of a sky portion comprising the steps of:

providing an LED fixture for creating an illusion of a sky portion;

providing an LED driver signal system configured to provide improved realism by persons viewing the LED fixture for extended periods of time, by utilizing multiple modulation methods which are not limited to circadian rhythms alone;

wherein said step of utilizing multiple modulation methods further comprises utilizing an ultradian modulation method;

wherein, the ultradian modulation method comprises:
using a light sensor to measure outdoor light intensity levels over a plurality of different periods of time, and generating datasets therefrom, where the variations in data reflects the presence of clouds passing between the light sensor and the sun;
using the datasets to generate grayscale videos where 100% brightness is white, and 0% brightness is black;
uploading the grayscale videos to a lighting controller;
randomly calling the grayscale videos throughout a day to provide an ultradian modulation method to LED driver signals;
wherein said lighting controller is the LPC 550;
wherein said fixture and said LED drive signal system provide output of light based upon registration of drive signals with predetermined locations of cloud images on an image panel;
wherein the ultradian modulation method is used for generating a driver signal to create an illusion of a non-static image of a cloud with a static image panel;
where the range of brightness is limited to being between 100% and 40%; and wherein said LED fixture comprises a plurality of parallel white LED strips, where a plurality of RGB LED modules are disposed between said plurality of parallel white LED strips; and each of the RGB LED modules is configured to provide light in six wavelengths-Lime Green, Mint Green, Amber, Red-Orange, Red, and Cool White so as to generates a high CRI (Color Rendering Index) that improves realism of the image on the image panel.

2. A trompe-l'oeil skylight fixture system comprising:
a fixture for generating a sky illusion, the fixture comprising:
a fixture structure;
an image panel, having a viewing side and an illumination side;
a parallel array of LED light strips to illuminate said image panel on said illumination side;
a plurality of RGB LED light modules each of which is disposed in registration with predetermined portion of said image panel, which correspond to predetermined locations of portions of images of clouds;
an LED driver system configured to power said parallel array of LED light strips and said plurality of RGB LED modules; and
where such LED driver system is configured to provide variations in power to each of said plurality of RGB LED light modules based upon desired changes of color of light and light intensity.

3. The system of claim 2 wherein said LED driver system accounts for circadian rhythms and ultradian rhythms shorter than a day.

4. The system of claim 2 further comprising a first subset of said plurality of RGB LED light modules which are provided with driver signals and a second subset are not provided with driver signals.

5. The system of claim 4 wherein said image panel is a first panel of a plurality of image panels each with a different scene thereon, said first subset of said plurality of RGB LED light modules are in registration with a first plurality of predetermined positions on said first panel.

6. The system of claim 4 wherein said image panel is a second image panel of said plurality of image panels, where a second plurality of predetermined positions on said second panel which are not in complete alignment with said first subset of said plurality of RGB LED light modules.

7. The system of claim 2 wherein said LED driver system is configured to simulate a non-static image by controlling RGB LED modules.

8. The system of claim 7 wherein said LED driver system is configured to respond to live actual input from an external source.

9. The system of claim 8 wherein said live actual input is from a camera or sensor at the same building address as the fixture structure.

10. The system of claim 9 wherein if said camera were to detect a large dense cloud outside said same building address, then a brightness characteristic of the signals output by said LED driver system would result in a decrease in brightness on the image panel.

11. The system of claim 2 wherein a plurality of RGB LED light modules each of which is not disposed in registration with predetermined portion of said image panel, which correspond to predetermined locations of portions of images of clouds; are not being driven by said LED driver system.

12. A method of making virtual skylights and windows and luminous sky ceilings, virtual windows and interior lights comprising the steps of:
providing an LED fixture for creating an illusion of a sky portion;
providing an LED driver signal system configured to provide improved realism by persons viewing the LED fixture for extended periods of time, by utilizing multiple modulation methods which are not limited to circadian rhythms alone;
wherein said step of utilizing multiple modulation methods further comprises utilizing an ultradian modulation method; and
wherein the ultradian modulation method comprises:
using a light sensor to measure outdoor light intensity levels over a plurality of different periods of time, and generating datasets therefrom, where variations in data reflect a presence of clouds passing between the light sensor and the sun.

13. The method of claim 12 further comprising the step of: using the datasets to generate grayscale videos where 100% brightness is white, and 0% brightness is black.

14. The method of claim 13 further comprising the step of: uploading the grayscale videos to a lighting controller.

15. The method of claim 14 further comprising the step of randomly calling the grayscale videos throughout a day to provide an ultradian modulation method to LED drive signals.

16. The method of claim 15 wherein said lighting controller is an LPC 550.

17. The method of claim 15 wherein said fixture and said LED driver signal system have provided output of light based upon registration of driver signals with predetermined locations of cloud images on an image panel.

18. A method of claim 16 wherein the ultradian modulation method is used for generating drive signal to create an illusion of a non-static image of a cloud with a static image panel.

* * * * *